United States Patent
Silvernail et al.

(10) Patent No.: US 6,597,111 B2
(45) Date of Patent: Jul. 22, 2003

(54) PROTECTED ORGANIC OPTOELECTRONIC DEVICES

(75) Inventors: Jeffrey Alan Silvernail, Yardley, PA (US); Michael Stuart Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 43 days.

(21) Appl. No.: 09/994,408

(22) Filed: Nov. 27, 2001

(65) Prior Publication Data

US 2003/0098647 A1 May 29, 2003

(51) Int. Cl.⁷ .................................. H01J 1/62
(52) U.S. Cl. ........................ 313/506; 313/509
(58) Field of Search ................ 313/498, 506, 313/509, 512

(56) References Cited

U.S. PATENT DOCUMENTS

| | | | |
|---|---|---|---|
| 4,842,893 A | 6/1989 | Yializis et al. | 427/497 |
| 4,913,762 A | 4/1990 | Kittler | 156/272.6 |
| 4,954,371 A | 9/1990 | Yializis | 427/497 |
| 5,260,095 A | 11/1993 | Affinito | 427/124 |
| 5,707,745 A | 1/1998 | Forrest et al. | 428/432 |
| 5,757,126 A | 5/1998 | Harvey, III et al. | 313/506 |
| 6,146,225 A | 11/2000 | Sheats et al. | 445/24 |
| 6,224,948 B1 | 5/2001 | Affinito | 427/488 |
| 6,268,695 B1 | 7/2001 | Affinito | 313/504 |

FOREIGN PATENT DOCUMENTS

| | | | |
|---|---|---|---|
| WO | WO 00/26973 | 5/2000 | H01L/151/20 |
| WO | WO 00/36664 | 6/2000 | H01L/52/20 |

OTHER PUBLICATIONS

Pocius, Alphonsus V., *Adhesion and Adhesives Technology: An Introduction*, Hanser Publishers, 1997, pp. 150–157 and 180–181.

Greger, Dr. Ralf, "Plasmatreatment of Polymers: An short overview over the possibilities of a modern production technology," Plasonic Oberflachentechnik GmbH, Gerlingen, Germany, Nov. 20, 1998, pp. 1–4.

*Primary Examiner*—Vip Patel
(74) *Attorney, Agent, or Firm*—Mayer Fortkort & Williams, PC; David B. Bonham, Esq.

(57) ABSTRACT

Disclosed are protected OLED devices comprising (a) a substrate; (b) an active region positioned on the substrate, wherein the active region comprises an anode layer, a cathode layer and a light-emitting layer disposed between the anode layer and the cathode layer; (c) a composite barrier layer disposed over the active region and/or over a surface of the substrate, the composite barrier layer comprising an alternating series of one or more polymeric planarizing sublayers and one or more high-density sublayers; and, (d) a thin carbon layer disposed between at least one polymeric planarizing sublayer and a region of the OLED device that is selected from the group consisting of the substrate, an adjacent high-density sublayer, and the active region. The composite barrier layer is provided to protect the active region of the OLED device from environmental elements such as oxygen and moisture. The thin carbon layer is provided to improve adhesion between adjacent layers. In other embodiments, the present invention provides an OLED device in which a surface of the substrate and/or a surface of a polymeric planarizing sublayer has been roughened by a plasma or chemical etching treatment to improve adhesion thereto.

34 Claims, 2 Drawing Sheets

PROTECTED ORGANIC OPTOELECTRONIC DEVICES

FIELD OF THE INVENTION

The present invention relates to organic optoelectronic devices, more particularly to organic light emitting devices (OLEDs) that are protected from environmental elements such as moisture and oxygen.

BACKGROUND OF THE INVENTION

Organic light emitting devices ("OLEDs"), including both polymer and small-molecule OLEDs, are potential candidates for a great variety of virtual- and direct-view type displays, such as lap-top computers, televisions, digital watches, telephones, pagers, cellular telephones, calculators and the like. Unlike inorganic semiconductor light emitting devices, organic light emitting devices are generally simple and are relatively easy and inexpensive to fabricate. Also, OLEDs readily lend themselves to applications requiring a wide variety of colors and to applications that concern large-area devices.

One factor limiting the practical application of OLEDs is their susceptibility to environmental elements such as moisture and oxygen. Oxygen and moisture can produce deleterious effects on certain OLED structural components, such as reactive metal cathode components. Without protection, the lifetime of the devices can be severely limited. For example, moisture and oxygen are known to increase "dark spot areas" in connection with OLED structures. The organic materials utilized in a conventional OLED structure can also be adversely affected by environmental species such as water and oxygen. Approaches to protecting OLEDs from environmental elements include, as discussed below, providing the OLED with a protective layer or cover that has decreased permeability to moisture and/or oxygen.

In general, two-dimensional OLED arrays for imaging applications are known in the art and typically include an OLED display area that contains a plurality of active regions or pixels arranged in rows and columns. FIGS. 1A and 1B are simplified schematic representations (cross-sectional view) of OLED structures provided with a protective layer. The OLED structure shown in FIG. 1A includes a single active region 15 which includes an electrode region such as anode region 12, a light emitting region 14 over the anode region 12, and another electrode region such as cathode region 16 over the light emitting region 14. The active region 15 is disposed on a substrate 10. Barrier layer 20 disposed over active region 15 is provided to restrict transmission of oxygen and water vapor from an outer environment to the active pixel 15.

In one common OLED structure in accordance with FIG. 1A, light from the light emitting layer 14 is transmitted downwardly through the substrate 10. In such a "bottom-emitting" configuration, the substrate 10 and anode 12 are formed of transparent materials. The cathode 16 and barrier layer 20 need not be transparent in this configuration. Moreover, structures are also known in which the positions of the anode 12 and cathode 16 in FIG. 1A are switched as illustrated in FIG. 1B. Such devices are sometimes referred to as "inverted OLEDs". In such an inverted OLED bottom-emitting configuration as illustrated in FIG. 1B, the cathode 16 and substrate 10 are formed of transparent materials, while the anode 12 and barrier layer 20 need not be transparent.

However, other OLED architectures are also known in the art, including "top-emitting" OLEDs and transparent OLEDs (or "TOLEDs"). For top-emitting OLEDs, light from the light emitting layer 14 is transmitted upwardly through barrier layer 20. In a top-emitting configuration like that shown in FIG. 1A, the cathode 16 and barrier layer 20 are formed of transparent materials while the substrate 10 and anode 12 need not be transparent. In an inverted top-emitting OLED configuration based on a design like that shown in FIG. 1B, the anode 12 and barrier layer 20 are formed of transparent materials. In this configuration, the cathode 16 and substrate 10 need not be transparent.

For TOLEDs, in which light is emitted from both the top and bottom of the device, the substrate 10, anode 12, cathode 16 and barrier layer 20 are formed of transparent materials. TOLEDs can be based on a configuration such as that shown in either FIG. 1A or FIG. 1B. Other OLED structures are known in the art and are suitable for use with the invention disclosed herein.

It is known to provide composite barrier layers in the form of a multilayer structure comprising an alternating series of one or more polymeric "planarizing" sublayers and one or more "high density" sublayers of inorganic or dielectric material. Such a multilayer structure can be applied directly onto the substrate or active region of an OLED device by use of a polymer multilayer process or ("PML" process). The PML process is disclosed, for example, in U.S. Pat. Nos. 4,842,893, 4,954,371, 5,260,095 and 6,224,948, all of which are incorporated herein in their entireties.

FIG. 2 shows a PML composite barrier layer 22 disposed on a top surface 11 of a substrate 10. The individual sublayers comprising composite barrier layer 22 are not shown in FIG. 2. The OLED structure shown in FIG. 2 includes a single active region 15 which includes an electrode region such as anode region 12, a light emitting region 14 over the anode region 12, and another electrode region such as cathode region 16 over the light emitting region 14. An additional barrier layer 20 is disposed over the active region 15, which can also be a multilayer structure, if desired. Composite barrier layer 22 is disposed on a top surface 11 of substrate 10, such that composite barrier layer 22 is positioned between substrate 10 and active region 15.

The PML process is advantageous because it is a vacuum compatible process which produces a conformal coating that does not require the separate attachment of a preformed multi-layer cover as is disclosed in the prior art for protecting an OLED from environmental elements. Moreover, the PML process produces a composite barrier layer with good resistance to moisture and oxygen penetration. The use of a PML composite barrier layer disposed on a substrate is particularly advantageous when the substrate is permeable to oxygen and moisture, as is often the case with polymeric substrates used in constructing flexible OLEDs (FOLEDs). Examples of OLEDs protected with a PML composite barrier layer are disclosed in, for example, U.S. Pat. Nos. 5,757,126, 6,146,225 and 6,268,695 all of which are incorporated herein in their entireties.

A typical PML composite barrier layer comprises a polymeric planarizing sublayer, which can be disposed over the OLED active region or over a surface of the substrate. A high-density sublayer is then disposed over this polymeric planarizing sublayer to form a first pair of sublayers. If desired, one or more additional pair(s) of sublayers may be deposited on the first pair of sublayers to provide a composite barrier layer comprising an alternating series of two or more polymeric planarizing sublayers layers and two or more high-density sublayers.

In certain OLED applications, such as bottom-emitting flexible OLEDs (FOLEDs), it is desirable that the substrate comprise a flexible and transparent polymeric material, such as polyethylene terephthalate (PET). Such an OLED can be protected from environmental elements by disposing a PML composite barrier layer 22 over a top surface 11 of the substrate 10 as shown in FIG. 2, such that the composite barrier layer is positioned between the substrate 10 and the active region 15. In FIG. 2, the polymeric planarizing sublayer contacts substantially the entire top surface 11 of the substrate 10. In general, it can be difficult to achieve adequate adhesion of one polymeric material to another polymeric material. Therefore, one difficultly presently associated with the use of a composite barrier layer, such as one formed by a PML process, is to effect adequate adhesion of a polymeric planarizing sublayer to a polymeric substrate. If inadequate adhesion is not obtained, separation or delamination of the composite barrier layer from the substrate may result. Partial or complete delamination renders the composite barrier layer substantially less effective to provide the OLED device with protection from environmental elements. It can also be difficult to effect adequate adhesion of a polymeric planarizing sublayer to an adjacent high-density sublayer or to a portion of the active region to which a composite barrier layer may be directly applied. This can also substantially compromise the effectiveness of the composite barrier layer to protect the OLED device from environmental elements such as moisture and oxygen.

SUMMARY OF THE INVENTION

In accordance with the foregoing it would, therefore, be desirable to provide an OLED device with a composite barrier layer in which a polymeric planarizing sublayer thereof has improved adhesion to a substrate, to an adjacent high-density sublayer and/or to the active region.

These and other challenges are addressed by the present invention which, in one embodiment, provides an OLED device comprising (a) a substrate; (b) an active region positioned over the substrate, wherein the active region comprises an anode layer, a cathode layer and a light-emitting layer disposed between the anode layer and the cathode layer; (c) a composite barrier layer disposed over the active region, over a surface of the substrate or both over the active region and over a surface of the substrate, the composite barrier layer comprising an alternating series of one or more polymeric planarizing sublayers and one or more high-density sublayers; and (d) a thin carbon layer disposed between at least one polymeric planarizing sublayer and a region of the OLED device selected from the group consisting of the substrate, an adjacent high-density sublayer, and the active region. The thin carbon layer has a thickness of preferably from about 3 to about 500 Å.

In some preferred embodiments, the OLED device is a flexible OLED (FOLED) that incorporates a flexible and transparent polymeric substrate. In these embodiments, it is preferred to incorporate the thin carbon layer at least on a surface of the substrate that would otherwise be in direct contact with a polymeric planarizing sublayer of the composite barrier layer.

In other preferred embodiments, the composite barrier layer is provided as a conformal protective layer disposed at least over the OLED active region, and over at least a portion of the substrate surface. One preferred composite barrier layer will encapsulate the OLED device, such that the composite barrier layer covers all surfaces of the OLED device, including the active region and substrate surfaces, that would otherwise be exposed to the surrounding environment.

In another embodiment, the present invention provides an OLED device comprising (a) a substrate; (b) an active region positioned over the substrate, wherein the active region comprises an anode layer, a cathode layer and a light-emitting layer disposed between the anode layer and the cathode layer; (c) a composite barrier layer disposed over the active region, over a surface of the substrate, or both over the active region and over a surface of the substrate, the composite barrier layer comprising an alternating series of one or more polymeric planarizing sublayers and one or more high-density sublayers; wherein a surface of the substrate or of at least one of the polymeric planarizing sublayers has been subjected to a plasma treatment or chemical etching treatment to provide a roughened surface. In this embodiment, particularly where the substrate comprises a polymeric material, such as a transparent and flexible polymeric material useful in FOLEDs, it is preferable to provide the device with at least a roughened substrate surface to improve adhesion of a polymeric planarizing sublayer of a composite barrier layer to the substrate surface.

In any embodiment of the present invention, it may be preferred to provide a composite barrier layer comprising an alternating series of two or more polymeric planarizing sublayers and two or more high-density sublayers.

Preferred substrate materials include ceramic materials such as glasses, silicon-based materials, polymeric materials and metallic materials.

These and other embodiments and advantages of the present invention will become readily apparent to those of ordinary skill in the art upon review of the disclosure to follow.

As is typically the case with such figures, the above are simplified schematic representations presented for purposes of illustration only, and the actual structures may differ in numerous respects, particularly including the relative scale of the components.

DETAILED DESCRIPTION OF THE INVENTION

The present invention now will be described more fully hereinafter with reference to the accompanying drawings in which preferred embodiments of the invention are shown. This invention may, however, be embodied in different forms and should not be construed as limited to the embodiments set forth herein.

As used herein, a "layer" of a given material includes a region of that material whose thickness is small compared to both its length and width. Examples of layers include sheets, foils, films, laminations, coatings, and so forth. As used herein a layer need not be planar, but can be bent, folded or otherwise contoured, for example, to at least partially envelop another component. As used herein a layer can also include multiple sub-layers. A layer can also consist of a collection of discrete portions, for example, a layer of discrete active regions comprising individual pixels.

In one embodiment, the present invention is directed to an OLED device comprising: (a) a substrate; (b) an active region positioned over the substrate, wherein the active region comprises an anode layer, a cathode layer and a light-emitting layer disposed between the anode layer and the cathode layer; (c) a composite barrier layer disposed over the active region and/or over a surface of the substrate, the composite barrier layer comprising an alternating series of one or more polymeric planarizing sublayers and one or more high-density sublayers; and (d) a thin carbon layer disposed between at least one polymeric planarizing sublayer and a region of the OLED device selected from the group consisting of the substrate, an adjacent high-density sublayer, and the active region.

Figure 3:
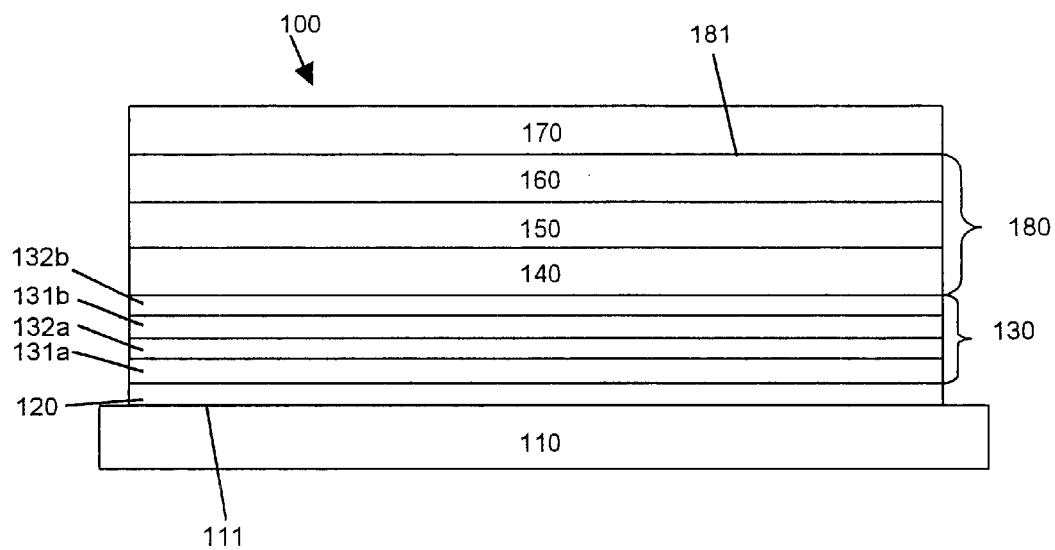
FIG. 3 is a simplified schematic representation (cross-sectional view) of an OLED device in accordance with one embodiment of the present invention.

FIG. 3 is a simplified schematic representation (cross-sectional view) of device 100 constructed in accordance with this embodiment of the present invention. Device 100 comprises substrate 110, thin carbon layer 120 disposed on a top surface 111 of substrate 110, composite barrier layer 130, anode layer 140, cathode layer 160, light-emitting layer 150 positioned between anode layer 140 and cathode layer 160, and top barrier region 170. Collectively, anode layer 140, light-emitting layer 150 and cathode layer 160 form active region 180. Active region 180 may form a single pixel. Multiple similar active regions, spaced from each other, may be constructed on a single substrate to form a display area comprising multiple individual pixels.

In the embodiment shown in FIG. 3, composite barrier layer 130 is disposed over thin carbon layer 120 such that composite barrier layer 130 is positioned between thin carbon layer 120 and active region 180. Composite barrier layer 130 comprises a plurality of cooperative barrier sub-layers that include both polymeric planarizing sublayers 131a, 131b and high-density sublayers 132a, 132b. These cooperative barrier sub-layers are preferably provided in an alternating configuration. Although FIG. 3 shows two pairs of cooperative barrier sub-layers, devices constructed in accordance with any embodiment of the present invention may be provided with from 1 to 10 pairs of these sub-layers, more preferably, from 2 to 7 pairs are used.

Polymeric planarizing sublayer 131a of composite barrier layer 130 contacts thin carbon layer 120 in the OLED shown in FIG. 3. In the absence of thin carbon layer 130, polymeric planarizing sublayer 131a would directly contact top surface 111 of substrate 110. Thin carbon layer 120 is provided to improve adhesion between polymeric planarizing sublayer 131a and substrate 110. Improved adhesion is particularly desirable, as in some preferred embodiments of the present invention, where the substrate comprises a polymeric material to which adequate adhesion of another polymeric material, such as that of a polymeric planarizing sublayer, can be difficult to obtain.

The composite barrier layer may also extend laterally downwardly from the top surface of the substrate and also cover the bottom surface of the substrate. In such embodiments, the composite barrier layer encapsulates the substrate. In these embodiments, an adhesion-improving thin carbon layer can be provided on all surfaces of the substrate, i.e., the top, bottom and side surfaces thereof, that would otherwise be in direct contact with a polymeric planarizing sublayer of the composite barrier layer.

Figure 1A:
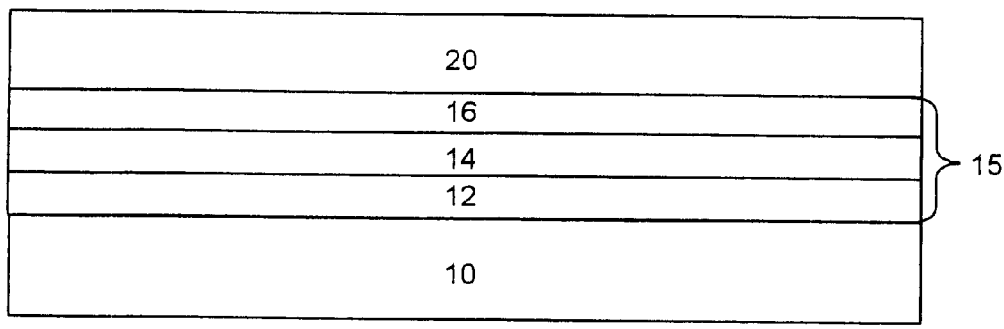
FIGS. 1A and 1B are simplified schematic representations (cross-sectional views) of OLED devices in standard and inverted configurations, respectively.
Figure 1B:
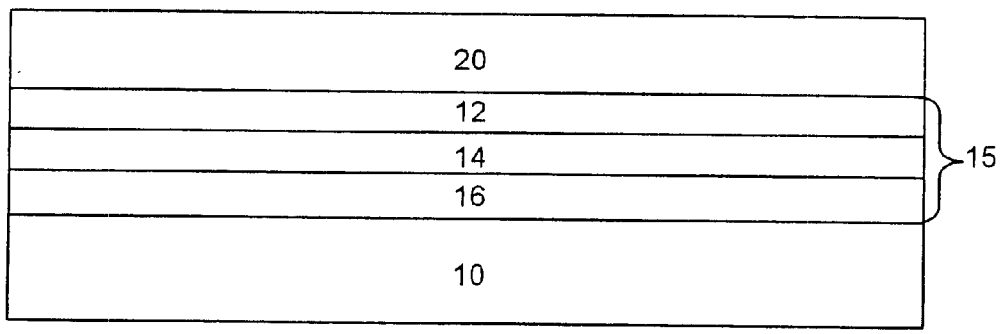
Figure 2:
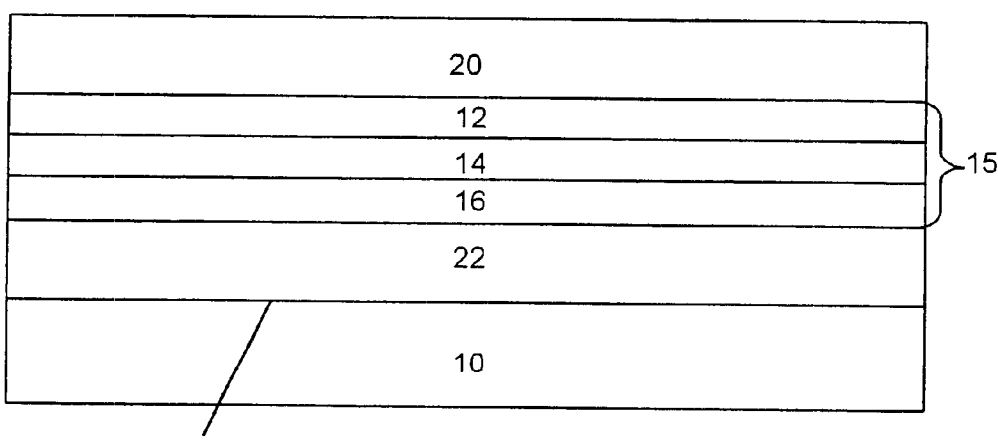
FIG. 2 is a simplified schematic representation (cross-sectional view) of an OLED device provided with a composite barrier layer disposed over the substrate and between the substrate and active region.

A composite barrier layer can also be disposed as a conformal coating over the active region and, in some embodiments, also over at least a portion of the substrate. In these embodiments, any surface of the substrate that would otherwise be in direct contact with a polymeric planarizing sublayer of the composite barrier layer can be provided with an adhesion-improving thin carbon layer. Such embodiments can be exemplified with reference to FIG. 3 in which top barrier layer 170 comprises a composite barrier layer. Composite barrier layer 170 can thus be provided so as to extend laterally downward from the top surface of the active region 180, into contact with any exposed regions of the top surface 111 of the substrate 110. In these embodiments, the top surface 181 of the active region 180 and the top surface 111 of the substrate 110 in FIG. 2 can be provided with a thin carbon layer to improve adhesion of a polymeric planarizing sublayer to any portions of the top surface 111 of the substrate 110 or the top surface 181 or the active region 180 that would otherwise be in direct contact with the polymeric planarizing sublayer. The composite barrier layer may also extend laterally downwardly from the top surface of the substrate and also cover the bottom surface of the substrate. In such an embodiment, the OLED device is encapsulated by the composite barrier layer. The composite barrier layer then covers all surfaces of the OLED device, including active region 180 and substrate 110, that would otherwise be exposed to the surrounding environment (note that by encapsulating the device in this fashion, composite barrier layer 130 may be unnecessary). In these embodiments, an adhesion-improving thin carbon layer can be provided on all surfaces of the device 100, i.e., the top, bottom and side surfaces thereof, that would otherwise be in direct contact with a polymeric planarizing sublayer of the composite barrier layer.

The adhesion-improving thin carbon layer has thus far been described in respect to improving adhesion of a polymeric planarizing sublayer to a substrate surface or active region surface, such as by providing the thin carbon layer as a coating onto a surface of the substrate or active region that would otherwise be in direct contact with a polymeric planarizing sublayer. An adhesion-improving thin carbon layer can also be provided between any polymeric planarizing sublayer and an adjacent high-density sublayer to improve adhesion of the polymeric planarizing sublayer to the adjacent high-density sublayer. In general, a thin carbon layer can be provided anywhere on or within a protected OLED structure wherein improved adhesion of a polymeric material, such as that of a polymeric planarizing sublayer, to any other portion, region or layer of the OLED structure is desired.

Thus, an adhesion-improving thin carbon layer used in the present invention will have a thickness effective to improve adhesion between a polymeric planarizing sublayer and an adjacent portion, region or layer of the OLED structure. It is preferred that the thin carbon layer have a thickness of from about 3 to about 500 Å, more preferably from about 3 to about 100 Å and even more preferably from about 3 to about 50 Å. It is particularly preferred that the thin carbon layer have a thickness of from about 3 to about 30 Å. Carbon layers of these thicknesses will be optically transparent, which is especially preferred where light from the OLED is required to travel through the carbon layer, for example, where the OLED is of a bottom-emitting configuration and where the thin carbon layer is disposed on a surface of a transparent substrate. Thin carbon layers can be applied onto a substrate or any other portion, region or layer of an OLED structure, such as onto a high-density sublayer or active region, by methods known in the art for providing a thin carbon layer onto a substrate. Among preferred methods for applying a thin carbon layer are coating methods including, but not limited to, sputtering and other conventional vacuum deposition techniques such as, chemical vapor deposition techniques including plasma-enhanced chemical vapor deposition (PECVD), laser-induced chemical vapor deposition (LCVD), microwave-assisted chemical vapor deposition, induction-assisted chemical vapor deposition, e-beam-assisted deposition techniques, ion implantation and pulsed laser ablation techniques.

An OLED device in accordance with any embodiment of the present invention may, as described hereinabove, be a top-emitting, bottom-emitting or transparent OLED (TOLED) and the positions of the anode and cathode may be reversed to form an inverted OLED structure. In some preferred embodiments, the device, such as that shown in FIG. 3, is a bottom-emitting OLED in which case the anode layer 140, composite barrier layer 130, thin carbon layer 120 and substrate 110 are transparent.

The cover region used in any embodiment of the present invention, such as the cover region 170 used in FIG. 3, may be any cover region conventionally used for effectively sealing the OLED active region. Thus, the cover region may comprise an inorganic material or an organic material, may be transparent or opaque (depending on the particular OLED configuration) and may be flexible or relatively rigid. The materials selected for the cover region will depend upon the application at hand, and include the various metals, semiconductors, ceramics and polymers described below with reference to the substrate. Moreover, as discussed further herein, the cover region can comprise a composite barrier region.

The substrate used in any embodiment of the present invention may be any substrate conventionally used for establishing an OLED active region thereon. Thus, the substrate may comprise an inorganic material or a polymeric material, may be transparent or opaque (depending on the particular OLED configuration) and may be flexible or relatively rigid.

The materials selected for the substrate will depend upon the application at hand. Metals offer excellent barrier properties. Preferred metals include aluminum, gold, nickel, nickel alloys and indium, as well as other metals known in the art.

Semiconductors such as silicon offer good barrier properties to water, oxygen and other harmful species and also provide a substrate upon which electronic circuitry can be built.

Ceramics also offer low permeability and provide transparency in some cases. Preferred ceramics are glasses, more preferably soda lime and borosilicate glasses. Glasses, although relatively rigid, are useful for bottom-emitting OLEDs and TOLEDs which require a transparent substrate.

Polymers are often preferred where optical transparency is desired or where ease of continuous manufacture (e.g., web-based manufacture) is desired. Polymers are particularly preferred substrate materials for flexible OLEDS (or "FOLEDS"). As the name suggests, these structures are flexible in nature.

Preferred low permeability polymers include polyesters, polyethersulphones, polyimides and fluorocarbons. Preferred polyesters include polyethylene terephthalate. Preferred fluorocarbon polymers include Aclar® fluoropolymer available from Honeywell. Where the substrate is polymeric material, it typically ranges from 75 to 625 microns in thickness.

A polymeric planarizing sublayer comprises a polymeric planarizing material that forms a smooth planar surface upon application, rather than forming a surface that reflects irregular contours of the underlying surface. Preferred thicknesses for the planarizing layers is typically 1,000 to 50,000 Å. Preferred polymeric planarizing materials include polymers such as fluorinated polymers, parylenes, cyclotenes and polyacrylates. Sub-layers of such planarizing materials 131a, 131b, such as shown in FIG. 3, can be provided using techniques known in the art, for example, by dipping, spin coating, sputtering, evaporative coating, spraying, flash evaporation, chemical vapor deposition, in-situ polymerization or curing of a monomer layer, and so forth.

In some preferred embodiments, the polymeric planarizing sublayer is a polyacrylate. A polyacrylate polymeric planarizing layer may be formed, for example, by vacuum deposition of a liquid acrylic monomer onto the thin carbon layer. The acrylic monomer is then polymerized or cross-linked by, for example, exposure to heat or to a radiation source such as a UV lamp. Among acrylic monomers useful for forming the polyacrylate layer are included, but not limited to, tripropyleneglycol diacrylate, tetraethylene glycol diacrylate, tripropylene glycol monoacrylate, caprolactone acrylate, and combinations thereof; methacrylic monomers; and combinations thereof.

A high-density sublayer comprises a high-density material with sufficiently close atomic spacing such that diffusion of contaminant and deleterious species, particularly water and oxygen, are hindered. Preferred high-density materials include inorganic materials such as metals and metal alloys, metal oxides, metal nitrides, metal carbides and metal oxynitrides. More preferred are silicon oxides (SiOx), including silicon monoxide (SiO) and silicon dioxide ($SiO_2$), silicon nitrides (typically $Si_3N_4$), silicon oxynitrides, aluminum oxides (typically $Al_2O_3$), indium-tin oxides (ITO) and zinc indium tin oxides. Sub-layers of high-density material 132a, 132b can be applied using techniques known in the art such as thermal evaporation, sputtering, PECVD methods and electron-beam techniques.

Additional information concerning the application of the composite barrier layer to the device by the PML process is disclosed in, e.g., U.S. Pat. Nos. 4,842,893, 4,954,371, 5,260,095 and 6,224,948, each of which is incorporated by reference herein in its entirety. Other adaptations of the PML process are known in the art and may, without limitation, be used herein to form the composite barrier layer. As seen from the above, when used to form a composite protective layer for an OLED, the PML process typically involves sequential deposition of a polymeric planarizing material followed by deposition of a high density material onto the planarizing material. For example, the deposition of a planarizing material such as a polyacrylate is described hereinabove. Moreover, a high density material is typically vacuum deposited after curing of the acrylic monomer as described hereinabove.

Examples of composite protective layers comprising sub-layers of both high-density material and planarizing material formed on a polymer substrate sublayer are disclosed, for example, in U.S. Pat. No. 5,757,126, the entire disclosure of which is hereby incorporated by reference.

In some preferred embodiments of the present invention, the polymeric planarizing layer is applied over a surface, such as active region 180 in FIG. 3 (e.g., where top barrier region 170 is a composite barrier region), that has been previously coated with a layer provided to protect active region 180 from damage that may otherwise be caused by direct application of the composite protective layer onto the active region. Useful materials for protecting the active region are disclosed in co-pending United States Patent Application Serial No., incorporated herein in its entirety.

The present invention is particularly suitable for application to flexible OLED (FOLED) devices in which the OLED active region is constructed on a flexible substrate that typically comprises a polymeric material. Polymeric materials are substantially more permeable to environmental elements such as oxygen and moisture than are typical relatively rigid substrates such as glass. Composite barrier layer 130, such as one formed by a PML process, therefore provides effective protection from environmental species such as water and/or oxygen to which a polymeric substrate would otherwise be permeable. An adhesion-improving layer in accordance with the present invention, thus enhances adhesion to the polymeric substrate of a polymeric planarizing sublayer of a composite barrier layer.

In another embodiment, the present invention is directed to an OLED device comprising (a) a substrate; (b) an active region positioned on the substrate, wherein the active region comprises an anode layer, a cathode layer and a light-emitting layer disposed between the anode layer and the cathode layer; (c) a composite barrier layer disposed over the active region and/or over a surface of the substrate, the composite barrier layer comprising an alternating series of one or more polymeric planarizing sublayers and one or more high-density sublayers; wherein a surface of the substrate or of at least one of the polymeric planarizing sublayers has been subjected to a plasma treatment or chemical etching treatment to provide a roughened surface.

Figure 4:
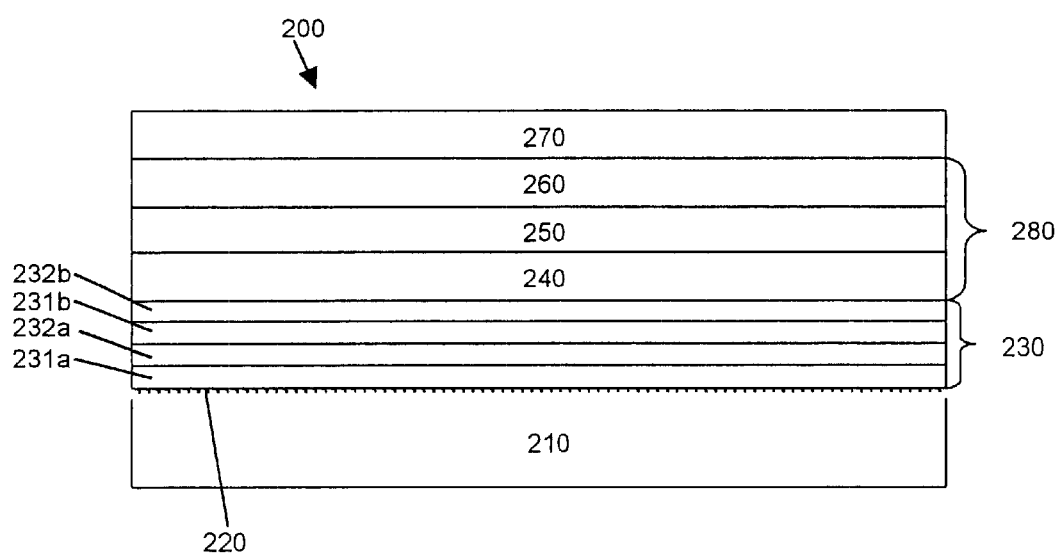
FIG. 4 is a simplified schematic representation (cross-sectional view) of an OLED device in accordance with another embodiment of the present invention.

FIG. 4 is a simplified schematic representation (cross-sectional view) of OLED device 200 constructed in accordance with this embodiment of the present invention. Device 200 comprises substrate 210 having roughened surface 220, composite barrier layer 230, anode layer 240, cathode layer 260, light-emitting layer 250 positioned between anode layer 240 and cathode layer 260, and top barrier region 270. Collectively, anode layer 240, light-emitting layer 250 and cathode layer 260 form active region 280. Active region 280 may form a single pixel. Multiple similar active regions, spaced from each other, may be constructed on a single substrate to form a display area comprising multiple individual pixels.

OLED device 200 shown in FIG. 4 is substantially similar to OLED device 100 shown in FIG. 3, however, in FIG. 4, the substrate 210 is provided with roughened surface 220 rather than a thin carbon layer 120 shown in FIG. 3. In the embodiment shown in FIG. 4, composite barrier layer 230 is disposed over roughened surface 220 such that composite barrier layer 230 is positioned between roughened surface 220 and active region 280. As in the OLED device shown in FIG. 3, composite barrier layer 230 comprises a plurality of cooperative barrier sub-layers that include both polymeric planarizing sublayers 231a, 231b and high-density sublayers 232a, 232b.

Polymeric planarizing sublayer 231a of composite barrier layer 230 contacts roughened surface 220 in the OLED device shown in FIG. 4. Roughened surface 220 is provided in the embodiment shown in FIG. 4 to improve adhesion between polymeric planarizing sublayer 231a and substrate 210. Substrate 210 can be provided with roughened surface 220 by plasma treatment or chemical etching. In a typical plasma treatment process, air close to the substrate surface is exposed to a high voltage which is believed to ionize species, such as oxygen molecules, which ionized species then bind to the surface of the substrate. In addition to roughening the surface, plasma treatment can cause at least a temporary reorientation of the molecules at the surface of the substrate. Adhesion of a polymeric planarizing sublayer may, therefore, be further enhanced if such sublayer is applied shortly after subjecting the surface to a plasma treatment, and before the surface molecules substantially return to their pre-treatment orientations.

Any surface of the substrate that would otherwise be in direct contact with a polymeric planarizing sublayer may be roughened by such treatment. Thus, where a composite barrier layer encapsulates an OLED device, as described hereinabove, the top, bottom and side surfaces of the substrate may be roughened to improve adhesion thereto of a polymeric planarizing sublayer of a composite barrier layer.

More generally, any portion, region or layer of an OLED device to which improved adhesion of a polymeric layer, such as a polymeric planarizing sublayer of a composite barrier layer, is desired, may be provided with a roughened surface in accordance with this embodiment of the present invention. In some embodiments of the present invention, it may, therefore, be desirable to provide a polymeric planarizing sublayer with a roughed surface to improve the adhesion thereto of an adjacent high-density sublayer.

Once a surface is roughened in accordance with the present invention, adjacent layers, regions or portions can be provided in a manner analogous to that discussed above in connection with surfaces provided with a thin carbon layer, providing similar improvements in adhesion to the subsequently added layers, regions or portions. By "roughened" as used herein is meant surface irregularities formed, for example, on a surface portion of a substrate or other portion, region or layer in an OLED device. Any surface that has been roughened will, therefore, be provided with irregularities that render it less smooth than in the absence of such treatment. The irregularities provided by, for example, plasma or chemical etching treatment will generally comprise only a surface portion of a substrate or other portion, region or layer of the OLED device. Surface irregularities introduced by plasma or chemical etching treatment will therefore, typically extend to a depth that represents a relatively small fraction of the total thickness of the substrate or other portion, region or layer of an OLED device that has been subjected to plasma or chemical etching treatment.

The active region of any OLED in accordance with the present invention can be configured in any manner known in the art. The active region of the OLED can comprise one or many active pixels, each of which typically comprises an anode layer, a cathode layer, and a light-emitting layer (emission layer) disposed between the anode and cathode layer. In any embodiment of the present invention, the positions of the anode and cathode layers may be reversed from those shown, for example, in FIGS. 3 and 4 to form an inverted OLED configuration.

Depending on the application, the anode layer in any OLED in accordance with the present invention may be transparent or opaque. Opaque anode materials include metals such as gold, chromium and magnesium/silver, while transparent anode materials include metal oxides such as indium tin oxide (ITO) and zinc tin oxide. Similarly, the cathode layer in any OLED in accordance with the present invention can be transparent or opaque depending on the application. Opaque cathode materials may include metals such as aluminum and aluminum/lithium or other materials is known in the art, while transparent cathode materials may include metal/metal oxide combinations such as Mg-Ag/ITO or other materials known in the art.

The light emitting layer of any OLED device in accordance with the present invention can be provided in connection with a number of configurations, including the following: (a) a three-layer configuration comprising a hole transporting sub-layer, an emission sub-layer and an electron transporting sub-layer (i.e., a double heterostructure configuration), (b) a two-layer configuration comprising a hole transporting sub-layer and a sub-layer that provides both emission and electron transporting functions (i.e., a single heterostructure configuration) and (c) a configuration comprising a single layer that provides hole transporting, electron transporting and emission functions (i.e., a single layer configuration). In each configuration, additional layers may also be present, for example, layers that enhance hole injection or electron injection, or layers that serve to block holes or electrons. Several structures for such devices are discussed, for example, in U.S. Pat. No. 5,707,745, the entire disclosure of which is hereby incorporated by reference. Other more complex OLED architecture is also practiced in the art and may be utilized in accordance with the present invention.

An OLED device in accordance with the present invention can also include getter protection as is known in the art. The getter regions can be formed from any getter material that reacts readily with active gases (including water and oxygen), forming stable low-vapor-pressure chemical compounds so as to remove the active gases from the gas phase. The getter region(s) provide an additional measure of protection in the event that reactive gases such as water and oxygen penetrate through any protective layer. In such event, the material of the getter regions reacts with and/or neutralizes the reactive gases before such gases can cause harm to the active region of the OLED.

Although the present invention has been described with respect to several exemplary embodiments, there are many other variations of the above-described embodiments that will be apparent to those of ordinary skill in the art. It is understood that these variations are within the teachings of the present invention, and that the invention is to be limited only by the claims appended hereto.

What is claimed is:

1. An OLED device comprising:
   (a) a substrate;
   (b) an active region positioned over said substrate, wherein said active region comprises an anode layer, a cathode layer and a light-emitting layer disposed between the anode layer and the cathode layer;
   (c) a composite barrier layer disposed over said active region, over a surface of said substrate or both over said active region and over a surface of said substrate, said composite barrier layer comprising an alternating series of one or more polymeric planarizing sublayers and one or more high-density sublayers;
   (d) a thin carbon layer disposed between at least one polymeric planarizing sublayer and a region of said OLED device selected from the group consisting of said substrate, an adjacent high-density sublayer, and said active region.

2. The OLED device of claim 1, wherein the thin carbon layer has a thickness of from about 3 to about 500 Å.

3. The OLED device of claim 1, wherein the thin carbon layer has a thickness of from about 3 to about 50 Å.

4. The OLED device of claim 1, wherein the thin carbon layer has a thickness of from about 3 to about 30 Å.

5. The OLED device of claim 1, wherein said substrate comprises an inorganic material or a polymeric material.

6. The OLED device of claim 5, wherein said substrate comprises a transparent material.

7. The OLED device of claim 5, wherein said substrate comprises glass, metal, or a silicon-based material.

8. The OLED device of claim 5, wherein said substrate comprises a polymeric material.

9. The OLED device of claim 8, wherein said substrate comprises a flexible polymeric material.

10. The OLED device of claim 8, wherein said substrate comprises one or more polymeric materials selected from the group consisting of polyesters, polyolefins, polycarbonates, polyethers, polyamides and polyfluorocarbons, and copolymers and mixtures thereof.

11. The OLED device of claim 1, wherein said composite barrier layer comprises an alternating series of two or more polymeric planarizing sublayers and two or more high-density sublayers.

12. The OLED device of claim 1, wherein said composite barrier layer is disposed on said thin carbon layer.

13. The OLED device of claim 12, wherein said thin carbon layer is disposed on a surface of said substrate.

14. The OLED device of claim 13, wherein said composite barrier layer encapsulates said OLED device.

15. The OLED device of claim 13, wherein said composite barrier layer encapsulates said substrate.

16. The OLED device of claim 1, wherein said polymeric planarizing sublayer comprises a material selected from the group consisting of fluorinated polymers, parylenes, cyclotenes, polyacrylates, and copolymers and mixtures thereof.

17. The OLED device of claim 1, wherein said high-density sublayer comprises a material selected from the group consisting of metals, metal oxides, metal nitrides, metal carbides and metal oxynitrides and mixtures thereof.

18. The OLED device of claim 17, wherein said high-density sublayer comprises a material selected from the group consisting of silicon, silicon oxides, silicon nitrides, silicon carbides, silicon oxynitrides, indium oxides, indium tin oxides, zinc indium tin oxides, tin oxides, aluminum oxides, aluminum nitrides, and titanium oxides and mixtures thereof.

19. An OLED device comprising:
   (a) a substrate;
   (b) an active region positioned over said substrate, wherein said active region comprises an anode layer, a cathode layer and a light-emitting layer disposed between the anode layer and the cathode layer;
   (c) a composite barrier layer disposed over said active region, over a surface of said substrate or both over said active region and over a surface of said substrate, said composite barrier layer comprising an alternating series of one or more polymeric planarizing sublayers and one or more high-density sublayers; wherein a surface of said substrate or of at least one of said polymeric planarizing sublayers has been subjected to a plasma treatment or chemical etching treatment to provide a roughened surface.

20. The OLED device of claim 19, comprising a roughened substrate surface.

21. The OLED device of claim 19, wherein said substrate comprises a transparent material.

22. The OLED device of claim 21, wherein said substrate comprises a polymeric material.

23. The OLED device of claim 22, wherein said substrate comprises a flexible polymeric material.

24. The OLED device of claim 22, wherein said substrate comprises one or more polymeric materials selected from the group consisting of polyesters, polyolefins, polycarbonates, polyethers, polyamides and polyfluorocarbons, and copolymers and mixtures thereof.

25. The OLED device of claim 19, wherein said composite barrier layer comprises an alternating series of two or more polymeric planarizing sublayers and two or more high-density sublayers.

26. The OLED device of claim 20, wherein said composite barrier layer is disposed over said roughened substrate surface.

27. The OLED device of claim 26, wherein said composite barrier layer encapsulates said OLED device.

28. The OLED device of claim 26, wherein said composite barrier layer encapsulates said substrate.

29. The OLED device of claim 19, wherein said polymeric planarizing sublayer comprises a material selected from the group consisting of fluorinated polymers, parylenes, cyclotenes, polyacrylates, and copolymers and mixtures thereof.

30. The OLED device of claim 19, wherein said high-density sublayer comprises a material selected from the group consisting of metals, metal oxides, metal nitrides, metal carbides and metal oxynitrides and mixtures thereof.

31. The OLED device of claim 30, wherein said high-density sublayer comprises a material selected from the group consisting of silicon, silicon oxides, silicon nitrides, silicon carbides, silicon oxynitrides, indium oxides, indium tin oxides, zinc indium tin oxides, tin oxides, aluminum oxides, aluminum nitrides, and titanium oxides and mixtures thereof.

32. The OLED device of claim 19, wherein said surface of said substrate or of said at least one of said polymeric planarizing sublayers has been subjected to a plasma treatment to provide a roughened surface.

33. The OLED device of claim 19, wherein said surface of said substrate or of said at least one of said polymeric planarizing sublayers has been subjected to a chemical etching treatment to provide a roughened surface.

34. An OLED device comprising:

(a) a transparent flexible polymeric substrate;

(b) an active region positioned over said transparent flexible substrate, wherein said active region comprises an anode layer, a cathode layer and a light-emitting layer disposed between the anode layer and the cathode layer;

(c) one or more composite barrier layers disposed over said active region and over a surface of said transparent flexible substrate, said composite barrier layers comprising an alternating series of one or more polymeric planarizing sublayers and one or more high-density sublayers; and (d) a thin carbon layer having a thickness of from about 3 to about 500 Å disposed between a polymeric planarizing sublayer and a surface of said substrate.

* * * * *